United States Patent
Lam et al.

(10) Patent No.: US 7,977,231 B1
(45) Date of Patent: Jul. 12, 2011

(54) DIE BONDER INCORPORATING DUAL-HEAD DISPENSER

(75) Inventors: Kui Kam Lam, Kwai Chung (HK); Yen Hsi Tang, Kwai Chung (HK); Yiu Yan Wong, Kwai Chung (HK); Hok Man Wan, Kwai Chung (HK)

(73) Assignee: ASM Assembly Automation Ltd (HK)

( * ) Notice: Subject to any disclaimer, the term of this patent is extended or adjusted under 35 U.S.C. 154(b) by 0 days.

(21) Appl. No.: 12/941,174

(22) Filed: Nov. 8, 2010

(51) Int. Cl.
*H01L 21/44* (2006.01)

(52) U.S. Cl. .................................. 438/612; 438/758

(58) Field of Classification Search .............. 438/758, 438/612; 257/783, 782, E23.04
See application file for complete search history.

(56) References Cited

U.S. PATENT DOCUMENTS

| | | | |
|---|---|---|---|
| 6,204,093 B1 * | 3/2001 | Ahmad | 438/118 |
| 6,331,452 B1 * | 12/2001 | Gall | 438/127 |
| 6,861,278 B2 * | 3/2005 | Quinones et al. | 438/51 |
| 7,358,117 B2 * | 4/2008 | Tan et al. | 438/109 |
| 7,575,953 B2 * | 8/2009 | Tan et al. | 438/110 |
| 7,799,610 B2 * | 9/2010 | Tan et al. | 438/110 |
| 7,851,930 B1 * | 12/2010 | Gupta | 257/787 |

* cited by examiner

*Primary Examiner* — Thao P. Le
(74) *Attorney, Agent, or Firm* — Ostrolenk Faber LLP (57) ABSTRACT

Adhesive is dispensed for conducting die bonding onto a substrate including rows of bond pads aligned along a first axis and columns of bond pads aligned along a second axis transverse to the first axis where target dispensing positions are located. A first dispensing head incorporating a first nozzle and a second dispensing head incorporating a second nozzle are provided and the substrate is fed along the first axis to a position where the first and second dispensing heads are located. Pattern recognition of a columnar section of the substrate comprising one or more consecutive columns of bond pads with an optical system may be conducted by moving the optical system along the second axis relative to the substrate. Thereafter, the first nozzle and the second nozzle are driven concurrently to dispense adhesive from the first and second nozzles onto the target dispensing positions in the same columnar section of the substrate.

20 Claims, 6 Drawing Sheets

DIE BONDER INCORPORATING DUAL-HEAD DISPENSER

FIELD OF THE INVENTION

The invention relates to a die bonder for electronic devices, and in particular, to a die bonder incorporating dual dispensing heads for simultaneous dispensing of one or more adhesives onto a substrate.

BACKGROUND AND PRIOR ART

During the production of semiconductor dice or chips, many semiconductor dice are formed together on a single wafer. The wafer is then cut to separate the individual dice. Each of these semiconductor dice should then be individually mounted onto a support surface for further processing by utilizing a die bonding process. Thereafter, electrical connections are created between the dice and external devices, and the dice are later encapsulated with a plastic compound to protect them from the environment.

In prior art die bonders the die bonding process includes the step of picking up an individual die with a bond arm from the wafer. The die is then transported to a bonding site for bonding onto a substrate which has an adhesive dispensed thereon to attach the die onto the substrate. A single head dispensing system is usually deployed to dispense an adhesive material onto the substrate. In order to increase throughput of the operation dispensing systems with dual heads may be used.

Figure 1:
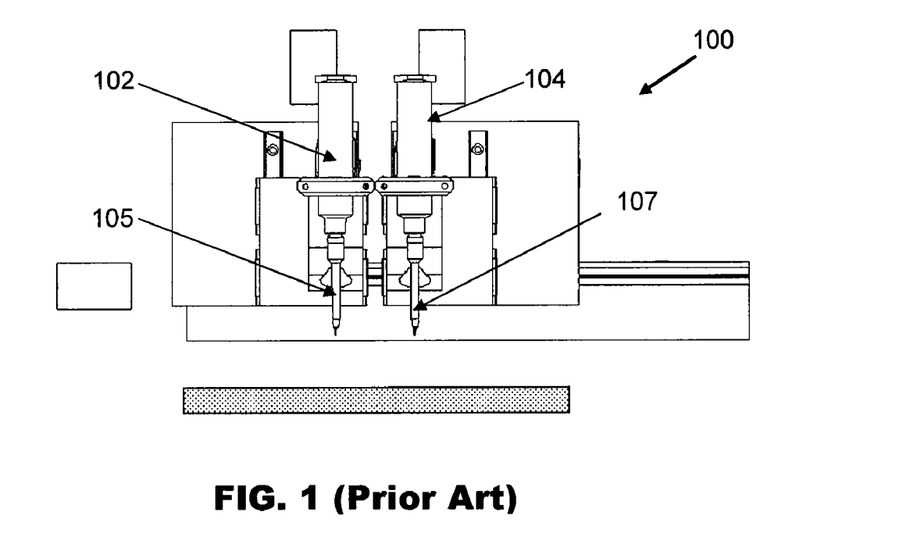
FIG. 1 is a front view of a conventional die bonder incorporating a dual-head dispensing system for dispensing adhesive such as epoxy.
Figure 2:
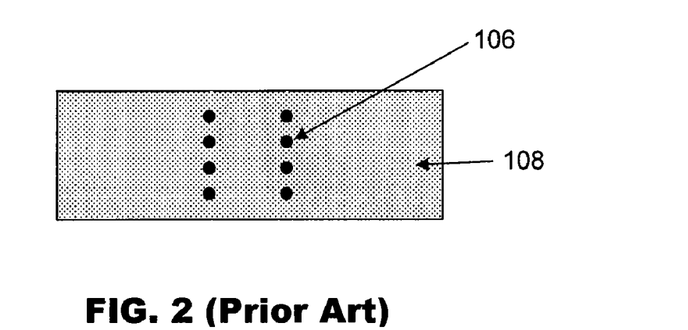
FIG. 2 is a top view of an anvil block with two columns of vacuum holes aligned adjacent to each other.

FIG. 1 is a front view of a conventional die bonder 100 incorporating a dual-head dispensing system for dispensing adhesive such as epoxy. The dual-head dispensing system comprises first and second epoxy dispensing heads 102, 104 mounted on separate XYZ motion tables. The first and second dispensing heads 102, 104 are equipped with an optical system each for pattern recognition of a position of a substrate before epoxy dispensation. The two dispensing heads 102, 104 are spaced apart and are movable independently on two separate work stations or conveyor mechanisms for dispensing adhesive from first and second dispensing nozzles 105, 107. Each work station comprises a set of vacuum holes 106 which may be arranged in a column for providing vacuum suction to hold a substrate firmly on an anvil block. FIG. 2 is a top view of an anvil block 108 with two columns of vacuum holes 106 aligned adjacent to each other.

Figure 3:
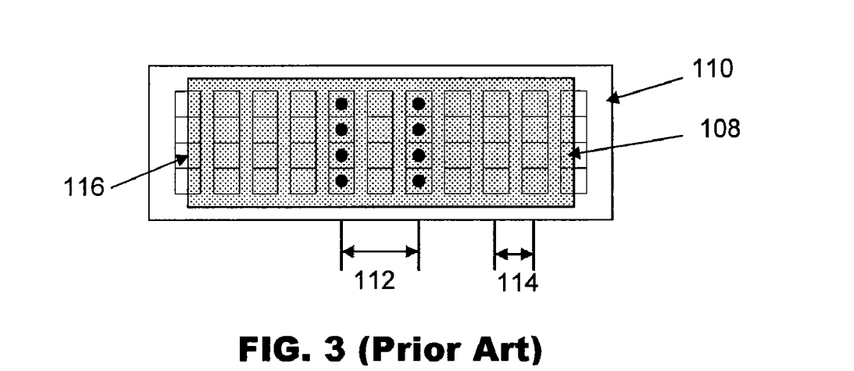
FIG. 3 illustrates a top view of a leadframe that is held on the anvil block of FIG. 2 by vacuum suction provided through the vacuum holes on the anvil block.

FIG. 3 illustrates a top view of a substrate or leadframe 110 that is held on the anvil block 108 of FIG. 2 by vacuum suction provided through the vacuum holes 106 on the anvil block 108. The positions of the first and second dispensing heads 102, 104 correspond to the arrangements of the two columns of vacuum holes 106. The two columns of vacuum holes 106 are in turn separated by a gap 112 determined by a column pitch 114 which separates two columns of die pads 116 on the leadframe 110. Typically, the column pitch 114 ranges from 2 mm to 70 mm. The smallest gap 112 achievable is limited by the geometrical arrangement of the first and second dispensing heads 102, 104.

As such, the arrangement of the first and second dispensing heads 102, 104 is constrained by the configuration of the leadframe 110. To cater for a complete range of column pitches 114 and to accommodate the sizes of different leadframes 110, a dispensing table with a long travel trajectory in the X-direction and a long anvil block 108 are required. Therefore, the space needed to accommodate multiple dispensing heads and the associated work stations is large and would be a serious limitation when there are space constraints. Furthermore, it is difficult to ensure that a long anvil block 108 is maintained totally flat in order to avoid vacuum leakage. As such, designs without screws are not possible due to the fear of vacuum leakage. It is therefore desirable to provide a dual-head dispensing system which is able to take up a smaller footprint as compared to the prior art described above.

SUMMARY OF THE INVENTION

It is thus an object of the invention to seek to provide a die bonder having at least two dispensing heads for dispensing one or more adhesives onto a substrate which will be capable of occupying less space as compared to the prior art described above.

According to a first aspect of the invention, there is provided a method of dispensing adhesive for conducting die bonding onto a substrate, the substrate including rows of bond pads aligned along a first axis and columns of bond pads aligned along a second axis transverse to the first axis where target dispensing positions are located, the method comprising the steps of: providing a first dispensing head incorporating a first nozzle and a second dispensing head incorporating a second nozzle; feeding the substrate along the first axis to a position where the first and second dispensing heads are located; conducting pattern recognition of a columnar section of the substrate comprising one or more consecutive columns of bond pads with an optical system by moving the optical system along the second axis relative to the substrate; and thereafter driving the first nozzle and the second nozzle to concurrently dispense adhesive from the first and second nozzles onto the target dispensing positions in the same columnar section of the substrate where pattern recognition has been conducted.

According to a second aspect of the invention, there is provided a method of dispensing adhesive for conducting die bonding onto a substrate, the substrate including rows of bond pads aligned along a first axis and columns of bond pads aligned along a second axis transverse to the first axis where target dispensing positions are located, the method comprising the steps of: providing a first dispensing head incorporating a first nozzle and a second dispensing head incorporating a second nozzle; feeding the substrate along the first axis to a position where the first and second dispensing heads are located; driving the first nozzle and the second nozzle to concurrently dispense adhesive from the first and second nozzles onto a first columnar section of the substrate comprising one or more consecutive columns of target dispensing positions on the bond pads; and thereafter driving the first nozzle and the second nozzle to concurrently dispense adhesive from the first and second nozzles onto a second columnar section of the substrate comprising one or more consecutive columns target dispensing positions on the bond pads adjacent to the first columnar section.

According to a third aspect of the invention, there is provided an adhesive dispenser for a die bonder for conducting die bonding onto a substrate including rows of bond pads aligned along a first axis and columns of bond pads aligned along a second axis transverse to the first axis where target dispensing positions are located, the adhesive dispenser comprising: a first dispensing head incorporating a first nozzle and a second dispensing head incorporating a second nozzle; a conveyor for feeding the substrate along the first axis to a position where the first and second dispensing heads are located; an optical system which is operative to conduct pattern recognition of a columnar section of the substrate comprising one or more consecutive columns of bond pads by relative movement between the optical system and the substrate along the second axis; and wherein the first nozzle and the second nozzle are configured and operative to concurrently dispense adhesive onto the target dispensing positions in the same columnar section of the substrate where pattern recognition has been conducted by the optical system.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of one preferred embodiment of the invention when considered with the accompanying drawings, in which.

DETAILED DESCRIPTION OF THE PREFERRED EMBODIMENT OF THE INVENTION

The preferred embodiment of the present invention will be described hereinafter with reference to the accompanying drawings.

Figure 4:
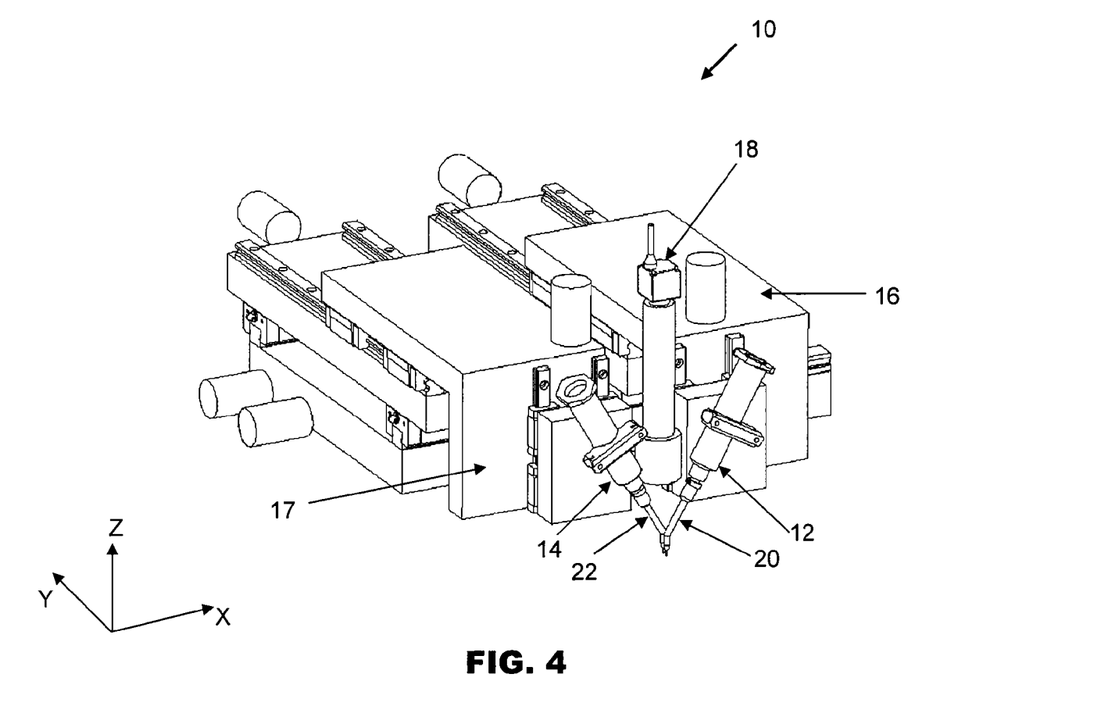
FIG. 4 is an isometric view of a die bonder incorporating a dual-head dispensing system according to the preferred embodiment of the invention.

FIG. 4 is an isometric view of a die bonder 10 incorporating a dual-head dispensing system according to the preferred embodiment of the invention. The dual-head dispensing system comprises first and second dispensing heads 12, 14 dispensing adhesives such as epoxy for conducting die bonding onto a substrate. One dispensing head 12 is mounted on a first positioning table, such as XYZ table 16, and the other dispensing head 14 is mounted on a second positioning table, such as XYZ table 17.

The first and second dispensing heads 12, 14 may also be mounted on a common X table such that the first and second XY tables 16, 17 share a single X guiding path and operates as a single module along the X axis. A fixed separation distance is thereby maintained between the first and second dispensing heads 12, 14 along the X axis. Alternatively, the first and second XY tables 16, 17 may be separate modules and operate wholly independently.

The dispensing system further includes a single optical system 18 which is mounted onto either the first or second XYZ table 16, 17. Alternatively, the optical system 18 may be mounted on a movable table which is movable independently of the first and second XYZ tables 16, 17. When pattern recognition for alignment is not required, the optical system 18 may be omitted from the dispensation system altogether.

At one end of the first and second dispensing heads 12, 14 are first and second nozzles 20, 22 respectively. The dispensing heads 12, 14 are tilted such that the nozzles 20, 22 are each slanted at an obliged angle with respect to a plane of the substrate. The slanted first and second nozzles 20, 22 allow the nozzles 20, 22 to be aligned along a same epoxy dispensing path in an overlapping dispensing region A of about 12 mm in width (see FIG. 6). Both the first and second nozzles 20, 22 are operative to concurrently dispense adhesive within this overlapping dispensing region A. Therefore, only one work station is required for dispensation of adhesives and the location of the work station is independent of a column pitch of the leadframe 24.

A trajectory in the X-direction of the work station is also significantly reduced and only a relatively short support surface such as an anvil block is required for supporting the substrate, which may be in the form of a leadframe 24. Thus, a smaller dispensation system can be used which requires a smaller machine footprint. Alternatively, dual dispensation using a single work station may also be achieved by cascading two single-head dispensing systems in a similar manner.

Figure 5:
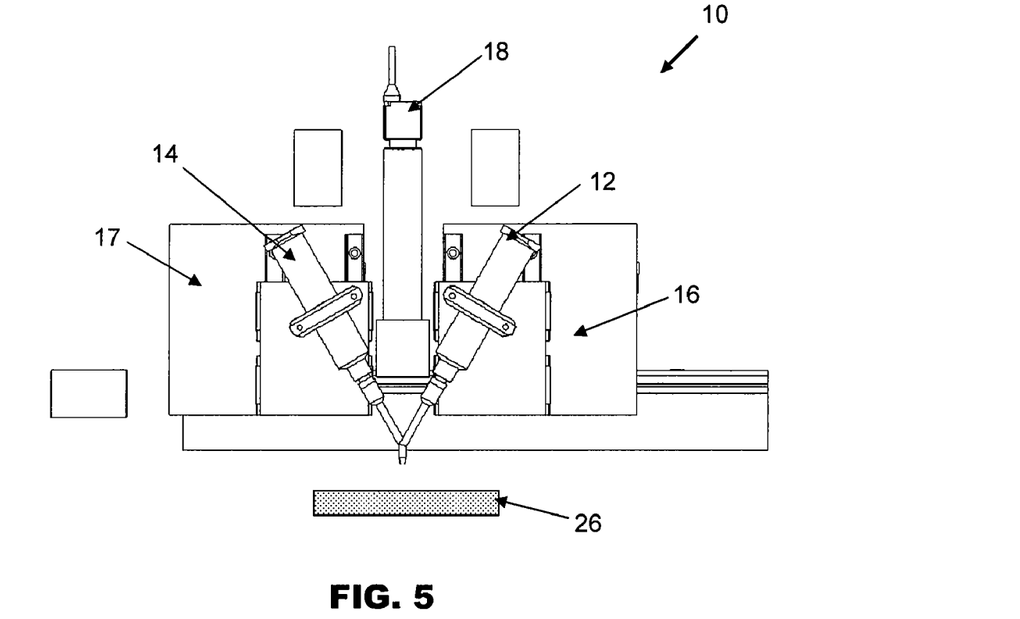
FIG. 5 is a front view of the die bonder of FIG. 4.
Figure 6:
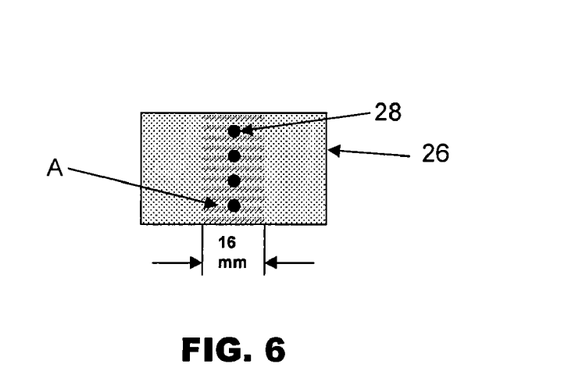
FIG. 6 is a top view of an anvil block configured with a single column of vacuum holes for supporting a leadframe for epoxy dispensation.

FIG. 5 is a front view of the die bonder 10 of FIG. 4. The first and second dispensing heads 12, 14 are operative to dispense an adhesive or epoxy in the overlapping dispensation area A (see FIG. 6) along a same columnar section of the leadframe 24 comprising one or more target dispensing positions on bond pads 25 comprised in the leadframe 24. In this example, the columnar section comprises a single column of bond pads on a leadframe 24 supported on the anvil block 26. Each bond pad 25 may comprise multiple target dispensing positions. FIG. 6 is a top view of the anvil block 26 with only a single column of vacuum holes provided on the anvil block 26 which is configured for securing a leadframe 24 by vacuum suction during epoxy dispensation. As the dispensing heads 12, 14 dispense onto target dispensing positions in the same column of bond pads 25 during dispensing, only one column of vacuum holes 28 on the anvil block 26 is required.

Figure 7:
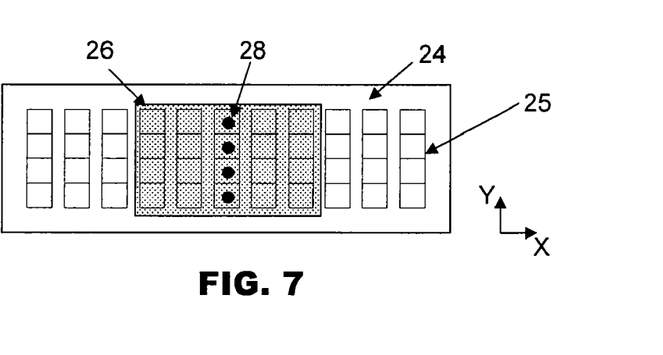
FIG. 7 illustrates a top view of a leadframe that is held onto the anvil block by vacuum suction provided through a single column of vacuum holes on the anvil block.

FIG. 7 illustrates a top view of a leadframe 24 which is held onto the anvil block 26 by vacuum suction provided through the single column of vacuum holes 28 on the anvil block 26. The substrate or leadframe 24 has rows of target dispensing positions on bond pads 25 aligned along the X axis and columns of target dispensing positions on bond pads 25 aligned along the Y axis, which is transverse to the X axis. The leadframe 24 is fed along the X axis to the anvil block 26 where the first and second dispensing heads 12, 14 are located, and where adhesive dispensation is performed after the leadframe 24 has been secured to the anvil block 26.

The anvil block 26 is relatively shorter than those used with the conventional die bonder 100 as discussed above since it is not necessary to cater for the column pitch of the leadframe 24 in order to align multiple columns of bond pads 25 with multiple columns of vacuum holes 28. A simpler design of the anvil block 26 can be achieved as compared to the prior art without requiring any screws. The trajectory in the X-direction of the work station is also reduced without affecting throughput.

Figure 8:
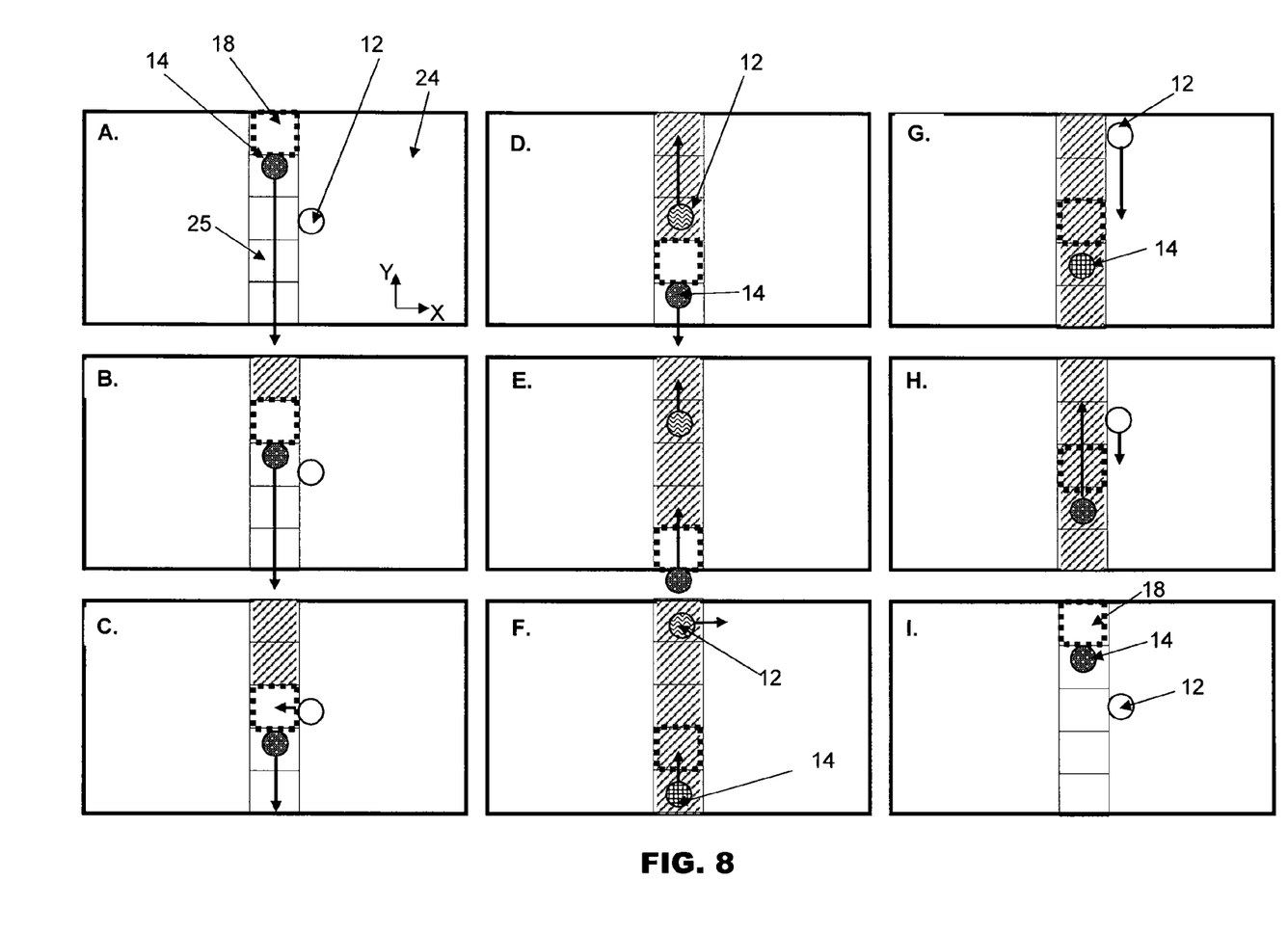
FIGS. 8A to 8I are schematic top views of the leadframe illustrating sequential steps of pattern recognition of the leadframe and adhesive dispensation for a single column of bond pads.

FIGS. 8A to 8I are schematic top views of the leadframe 24 illustrating sequential steps of pattern recognition of the leadframe 24 and adhesive dispensation for a single column of bond pads 25. The first dispensing head 12 is in a standby mode adjacent to a selected column of bond pads 25 being scanned. The optical system 18 carries out pre-dispensation pattern recognition of the leadframe 24. Pattern recognition begins using the optical system 18 from the rear of the column of bond pads 25 to the front in a direction towards the operator. The second dispensing head 14 is moved together with the optical system 18 along the pattern recognition pathway to the front of the leadframe 24 as shown in FIGS. 8A and 8B.

The first dispensing head 12 moves over a bond pad 25 near the middle of the leadframe 24 after the optical system 18 has viewed and advanced over the said middle of the leadframe 24 as shown in FIG. 8C. The first dispensing head 12 begins dispensing epoxy from the middle of the leadframe 24 onto target dispensing positions on the bond pads 25 and continues towards the rear thereof on substantially one half of the leadframe 24 while the optical system 18 continues pre-dispensing pattern recognition of the leadframe 24 towards the front as shown in FIG. 8D. The second dispensing head 14 starts dispensing to target dispensing positions on the remaining bond pads 25 comprised in the other half of the leadframe 24 from the front towards the rear as soon as the optical system 18 completes the pre-dispensing pattern recognition of the said column of bond pads 25 as shown in FIG. 8E.

Thereafter, the first dispensing head 12 moves away from the column of bond pads 25 as in FIG. 8F and moves towards the middle of the column to resume the standby position after it has completed epoxy dispensing in the rear half of the leadframe 24. At the same time, the second dispensing head 14 completes epoxy dispensing for the rest of the column of bond pads 25 towards the middle bond pad until the entire column of bond pads has received epoxy. The leadframe 24 is indexed accordingly to locate an adjacent column of bond pads for pattern recognition and epoxy dispensation while the optical system 18 moves back to the rear of the leadframe 24, ready to start another cycle of pattern recognition. The second dispensing head 14 also moves towards the rear of the leadframe together with the optical system 18 as shown in FIGS. 8H and 8I. The first and second dispensing heads 12, 14 generally assume the same positions as illustrated in FIG. 8A for a new cycle of pattern recognition and adhesive dispensation on the next column of bond pads 25.

Figure 9A:
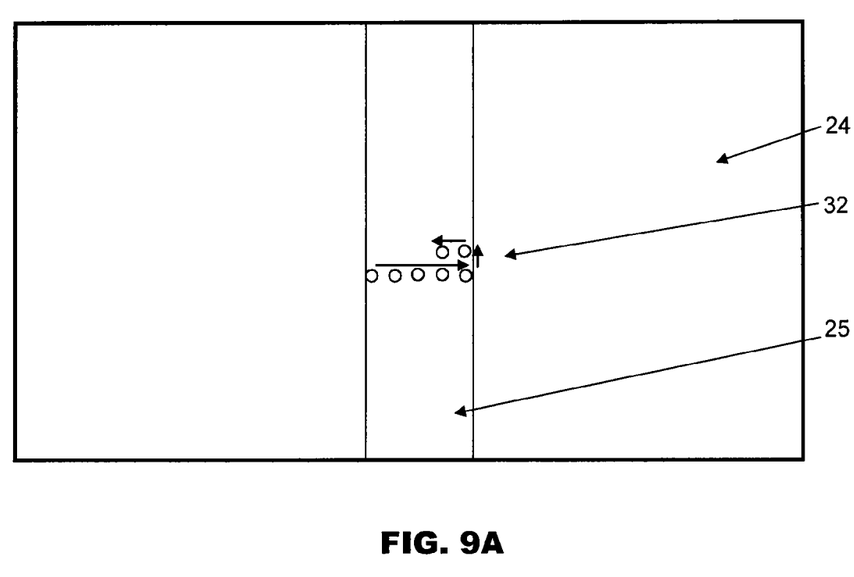
FIGS. 9A to 9C are schematic top views of the leadframe illustrating sequential steps of adhesive dispensation for multiple columns of bond pads.
Figure 9B:
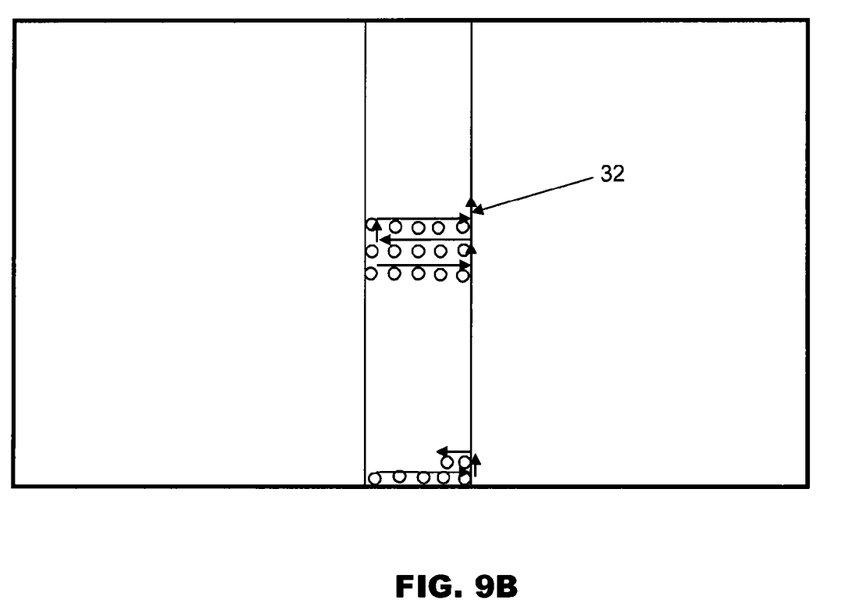
Figure 9C:
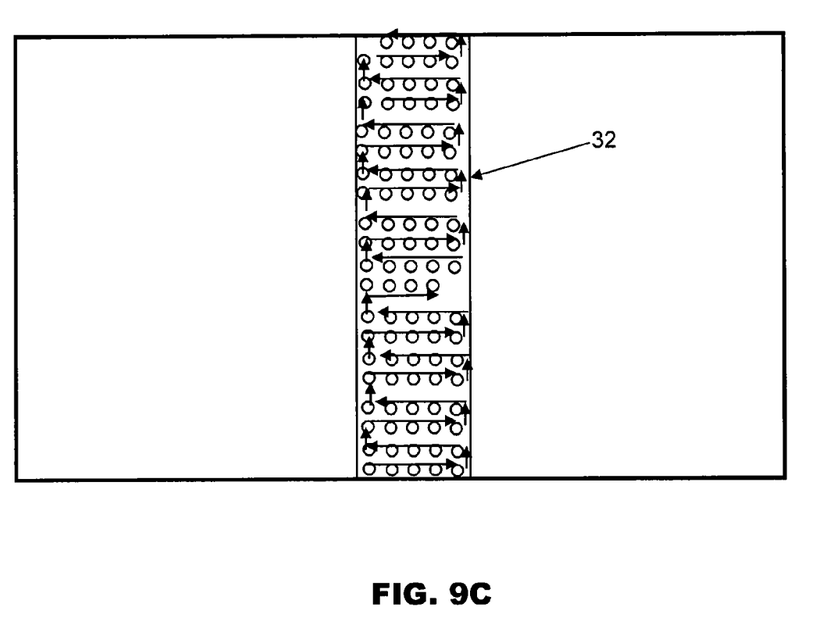

FIGS. 9A to 9C are schematic top views of the leadframe 24 illustrating sequential steps of adhesive dispensation for multiple target dispensing positions on multiple columns of bond pads 25. In this alternative preferred embodiment, the columnar section to which the first and second dispensing heads 12, 14 concurrently dispense adhesive comprises multiple consecutive columns of bond pads 25. The first or the second dispensing head 12, 14 starts dispensing epoxy across several columns of target dispensing positions along the middle row of the multiple columns of bond pads 25 in FIG. 9A after pattern recognition of a bonding path 32 incorporating multiple columns of consecutive bond pads has been completed. The other dispensing head positioned to dispense epoxy from the rear row once pattern recognition has been completed is also shown in FIG. 9B. The first and second dispensing heads 12, 14 operate concurrently. One dispensing head 12 operates substantially in the first half and the other dispensing head 14 operates substantially in the second half of the leadframe 24. They are respectively dispensing epoxy to multiple columns of bond pads row-by-row instead of onto a single column of bond pads as shown in FIGS. 8A to 8I. Following the repeated sequences of pattern recognition and epoxy dispensation, multiple columns of bond pads can receive dispensed epoxy more quickly to increase throughput tremendously. The travel paths of the first and second dispensing heads 12, 14 relative to the leadframe 24 from front to rear rows of bond pads across several consecutive columns are as shown in FIG. 9C which also illustrates the end-result of the dispensation.

It should be appreciated that the die bonder 10 incorporating the dual-dispensing system in accordance with the preferred embodiment of the invention achieves adhesive dispensation with increased throughput. The overlapping site for dispensing adhesives concurrently using the first and second dispensing heads 12, 14 requires a shorter X trajectory path, a single row of vacuum holes 28 and one optical system 18. Therefore, a reduced machine footprint with only one work station and a simple and short anvil block design can be utilised. The overall cost of the machine is also reduced.

The invention described herein is susceptible to variations, modifications and/or addition other than those specifically described and it is to be understood that the invention includes all such variations, modifications and/or additions which fall within the spirit and scope of the above description.

The invention claimed is:

1. A method of dispensing adhesive for conducting die bonding onto a substrate, the substrate including rows of bond pads aligned along a first axis and columns of bond pads aligned along a second axis transverse to the first axis where target dispensing positions are located, the method comprising the steps of:

providing a first dispensing head incorporating a first nozzle and a second dispensing head incorporating a second nozzle;

feeding the substrate along the first axis to a position where the first and second dispensing heads are located;

conducting pattern recognition of a columnar section of the substrate comprising one or more consecutive columns of bond pads with an optical system by moving the optical system along the second axis relative to the substrate; and thereafter driving the first nozzle and the second nozzle to concurrently dispense adhesive from the first and second nozzles onto the target dispensing positions in the same columnar section of the substrate where pattern recognition has been conducted.

2. The method of dispensing adhesive as claimed in claim 1, wherein the first and second nozzles dispense adhesive onto multiple rows of target dispensing positions on a single column of bond pads concurrently before dispensing adhesive onto an adjacent column of bond pads.

3. The method of dispensing adhesive as claimed in claim 2, wherein the first and second nozzles concurrently dispense adhesive onto target dispensing positions on the single column of bond pads while moving only along the second axis and without moving along the first axis.

4. The method of dispensing adhesive as claimed in claim 1, wherein the first and second dispensing heads are mounted on a common positioning table for driving the first and second dispensing heads along the first axis, and the common positioning table maintains a fixed separation distance between the first and second dispensing heads along the first axis while the first and second nozzles are driven along the second axis to dispense adhesive.

5. The method of dispensing adhesive as claimed in claim 1, wherein the optical system is mounted onto a positioning table on which the first dispensing head is mounted.

6. The method of dispensing adhesive as claimed in claim 1, wherein the first nozzle is slanted at an oblique angle with respect to a plane of the substrate.

7. The method of dispensing adhesive as claimed in claim 6, wherein the second nozzle is also slanted at an oblique angle with respect to the plane of the substrate.

8. The method of dispensing adhesive as claimed in claim 1, wherein a dispensing region where the first nozzle is operative to dispense adhesive overlaps with a dispensing region where the second nozzle is operative to dispense adhesive when the first and second nozzles are concurrently dispensing adhesive.

9. The method of dispensing adhesive as claimed in claim 1, further comprising the step of securing the substrate to the support surface by vacuum suction during the dispensing of adhesive by providing a support surface with a single column of vacuum holes provided on the support surface.

10. The method of dispensing adhesive as claimed in claim 1, wherein during the step of concurrently dispensing adhesive from the first and second nozzles onto target positions in the columnar section of bond pads, the first nozzle dispenses adhesive to substantially one half of the columnar section comprising multiple consecutive rows of bond pads, and the second nozzle dispenses adhesive to a remainder of the columnar section comprising multiple consecutive rows of bond pads.

11. The method of dispensing adhesive as claimed in claim 10, wherein the steps of pattern recognition and adhesive dispensation further comprise the steps of:
conducting pattern recognition with the optical system by scanning the columnar section of bond pads from one end to an opposite end thereof;
using the first nozzle to start dispensing adhesive to target dispensing positions in substantially one half of the columnar section on which the optical system has completed pattern recognition; and thereafter
using the second nozzle to start dispensing adhesive to target dispensing positions in the remaining bond pads of the columnar section which do not receive adhesive from the first nozzle after pattern recognition on the entire columnar section has been completed.

12. The method of dispensing adhesive as claimed in claim 11, further comprising the step of moving the first nozzle to a standby position after it has dispensed adhesive to target dispensing positions in substantially one half of the columnar section of bond pads, while waiting for dispensing to the remainder of target dispensing positions in the columnar section to be completed by the second nozzle.

13. A method of dispensing adhesive for conducting die bonding onto a substrate, the substrate including rows of bond pads aligned along a first axis and columns of bond pads aligned along a second axis transverse to the first axis where target dispensing positions are located, the method comprising the steps of:
providing a first dispensing head incorporating a first nozzle and a second dispensing head incorporating a second nozzle;
feeding the substrate along the first axis to a position where the first and second dispensing heads are located;
driving the first nozzle and the second nozzle to concurrently dispense adhesive from the first and second nozzles onto a first columnar section of the substrate comprising one or more consecutive columns of target dispensing positions on the bond pads; and thereafter
driving the first nozzle and the second nozzle to concurrently dispense adhesive from the first and second nozzles onto a second columnar section of the substrate comprising one or more consecutive columns target dispensing positions on the bond pads adjacent to the first columnar section.

14. The method of dispensing adhesive as claimed in claim 13, further comprising the step of conducting pattern recognition of each columnar section with an optical system by moving the optical system along the second axis relative to the substrate prior to concurrently dispensing adhesive onto the columnar section with the first and second nozzles.

15. An adhesive dispenser for a die bonder for conducting die bonding onto a substrate including rows of bond pads aligned along a first axis and columns of bond pads aligned along a second axis transverse to the first axis where target dispensing positions are located, the adhesive dispenser comprising:
a first dispensing head incorporating a first nozzle and a second dispensing head incorporating a second nozzle;
a conveyor for feeding the substrate along the first axis to a position where the first and second dispensing heads are located;
an optical system which is operative to conduct pattern recognition of a columnar section of the substrate comprising one or more consecutive columns of bond pads by relative movement between the optical system and the substrate along the second axis; and
wherein the first nozzle and the second nozzle are configured and operative to concurrently dispense adhesive onto the target dispensing positions in the same columnar section of the substrate where pattern recognition has been conducted by the optical system.

16. The adhesive dispenser as claimed in claim 15, wherein the first and second dispensing heads are mounted on a common positioning table that is operative to drive the first and second dispensing heads along the first axis, and the common positioning table maintains a fixed separation distance between the first and second dispensing heads along the first axis while the first and second nozzles are driven along the second axis to dispense adhesive onto the target dispensing positions.

17. The adhesive dispenser as claimed in claim 15, wherein the optical system is mounted onto a positioning table on which the first dispensing head is mounted.

18. The adhesive dispenser as claimed in claim 15, further comprising a support surface with a single column of vacuum holes provided on the support surface, the single column of vacuum holes being operative to secure the substrate to the support surface by vacuum suction during the dispensing of adhesive.

19. The adhesive dispenser as claimed in claim 15, wherein the first nozzle is slanted at an angle to a vertical.

20. The adhesive dispenser as claimed in claim 19, wherein the second nozzle is also slanted at an angle to the vertical.

* * * * *